United States Patent [19]

Ko et al.

[11] 4,013,891
[45] Mar. 22, 1977

[54] METHOD FOR VARYING THE DIAMETER OF A BEAM OF CHARGED PARTICLES

[75] Inventors: Wen-Chuang Ko, Wappingers Falls, N.Y.; Erich Sawatzky, San Jose, Calif.

[73] Assignee: IBM Corporation, Armonk, N.Y.

[22] Filed: Dec. 15, 1975

[21] Appl. No.: 641,054

[52] U.S. Cl. .......................... 250/492 A; 250/398
[51] Int. Cl.² .................................. H01J 37/00
[58] Field of Search ............ 250/492 A, 398, 397, 250/396

[56] References Cited

UNITED STATES PATENTS

| | | | |
|---|---|---|---|
| 3,434,894 | 3/1969 | Gale | 250/492 A |
| 3,619,608 | 11/1971 | Westerberg | 250/492 A |
| 3,689,782 | 9/1972 | Epstein et al. | 250/398 |

OTHER PUBLICATIONS

"Focused Ion Beams in Microfabrication," Seilger et al., J. Appl. Phys., vol. 45, No. 3, Mar. 1974, pp. 1416–1422.

Primary Examiner—Alfred E. Smith
Assistant Examiner—B. C. Anderson
Attorney, Agent, or Firm—J. B. Kraft

[57] ABSTRACT

In the bombardment of targets with beams of charged particles, a method for varying and controlling the diameter of such beams by passing the beam through an envelope of conductive material; the envelope is spaced from and coaxial with the beam. A selected D.C. potential is applied to the envelope, and the beam diameter is controlled by changing this applied potential in a direction away from ground potential to increase the beam diameter or by changing the potential in a direction toward ground potential to decrease said beam diameter.

10 Claims, 3 Drawing Figures

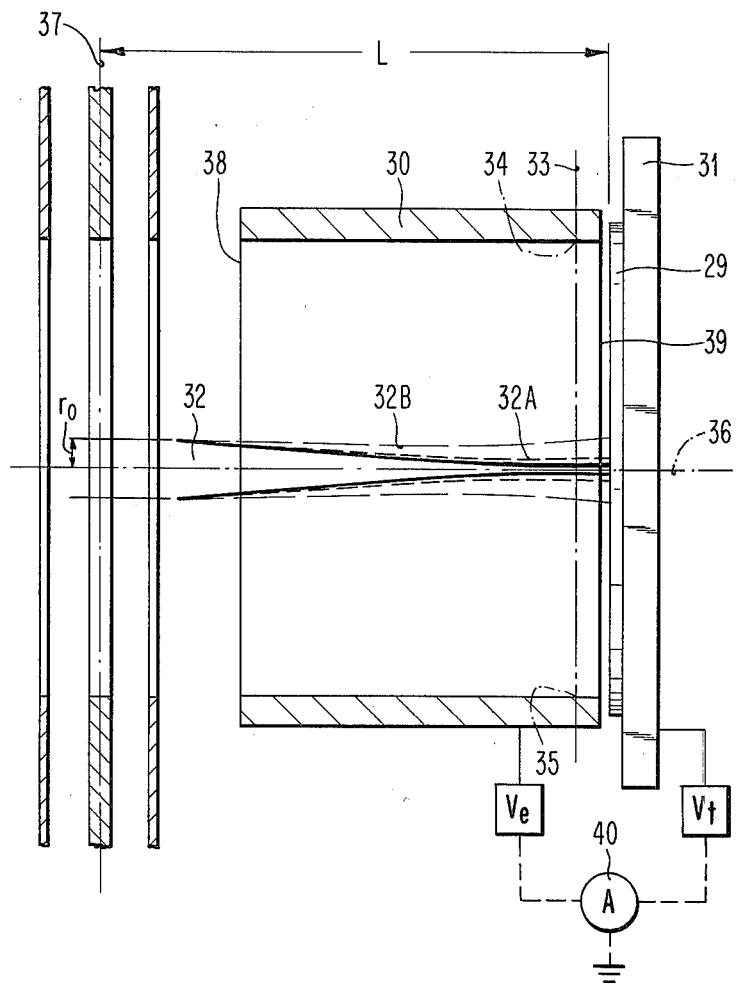

METHOD FOR VARYING THE DIAMETER OF A BEAM OF CHARGED PARTICLES

BACKGROUND OF THE INVENTION

The present invention relates to controlling the diameter of beams of charged particles particularly ion beams or electron beams more particularly when such beams are used for ion writing or electron beam writing.

Ion beam writing and electron beam writing are techniques utilized in integrated circuit fabrication involving the use of focused beams of either ions or electrons which are impinged upon a target. Such beams, which have diameters in the order of 1 micron in the case of ions and sub-micron in the case of electron beams, are scanned across the target in a selected programmed fashion to produce a selected geometric pattern on the target.

The target may be a photoresist coated integrated circuit wafer in which case the pattern determines the areas in the photoresist which are exposed, as described, for example, in the article, "Electron Bean and Ion Beam Fabricated Microwave Switch," E. D. Wolf et al, I.E.E.E. Transactions on Electron Devices, Volume ED 17, No. 6., June 1970, Pages 446 – 449. The ion writing method may also involve the implantation of patterns of ions of a selected conductivity-type in a semiconductor substrate to form the active and passive regions in the integrated circuit as described in the article, "Focused Ion Beams in Microfabrication," R. L. Seliger et al, Journal Applied Physics, Volume 45, No. 3, March 1974, Pages 1416 – 1422.

In the fabrication of integrated circuits, the selected pattern which is to be formed or "written" by the beam on a wafer surface will have areas of varying lateral dimensions. In order to form such areas most effectively, it would be desirable to have the capability of varying the dimensions of the beam during the programmed writing operation. With prior art beam writing methods, beam diameter variations particularly during the programmed beam writing operation would be very cumbersome. For example, there are analyzing magnets available in ion implantation systems with rotatable pole inserts having the capability of varying the beam diameter. However, the variation of such pole pieces is conventially done manually requiring a halt in the writing operations in order to make the necessary adjustments in the pole inserts. Such an approach does not appear to be adaptable to a continuous programmed ion writing operation across the surface of a wafer.

Another approach by which the beam diameter may be varied is by changing the spacing within focusing lenses or acceleration lenses. This approach also must be done manually and is quite cumbersome requiring a halt in the ion beam or E-beam writing operations.

Still another approach of varying beam diameter involves changing the voltage levels supplied to the focusing lenses or the accelerator lenses. While this approach may be accomplished without halting the operation, any changes by this method give rise to spherical aberration which must be compensated for. Means for continuously compensating for such changes in spherical aberration are likely to be quite complex and difficult to implement in a continuous beam writing operation.

SUMMARY OF THE PRESENT INVENTION

Accordingly, it is an object of the present invention to provide a method for varying the diameter of a beam of charged particles without interrupting a beam writing operation. It is a further object of the present invention to provide a method for varying the diameter of a beam of charged particles without interrupting a continuous programmed beam writing operation in the fabrication of integrated circuits.

Yet a further object of the present invention is to provide a method for varying the diameter of an ion beam without interrupting a continuous program-controlled method of ion implantation in the fabrication of integrated circuits.

It is still a further object of the present invention to provide a method for varying the beam diameter in either an electron beam or ion beam during a beam writing operation wherein a photoresist layer is being continuously exposed to a selected geometric pattern under programmed control.

In accordance with the present invention, in the method of bombarding a target with a beam of charged particles such as ions or electrons, there is provided a method for varying the diameter of the beam without interrupting the bombardment process which comprises focusing the beam through a lens and passing the focused beam through an envelope of conductive material which envelope is spaced from and coaxial with the beam. A selected D.C. potential is applied to the envelope, and the beam diameter is then controlled by changing the potential applied to the envelope. In order to increase the beam diameter, the potential is changed in a direction away from ground potential, i.e., making a positive potential more positive or a negative potential more negative. Conversely, the beam diameter is decreased by changing the potential in a direction toward ground potential, i.e., making a positive potential less positive or a negative potential less negative.

Preferably, at least a portion of the envelope is disposed between the lens and the beam. For best results the focal point of the beam should be substantially at the target.

As will be explained in greater detail hereinafter, the change in potential level of the envelope changes the space charge of secondary particle in the beam which normally neutralize the primary or effective particles in the beam. This change in space charge affects the diameter of the beam. In an unneutralized beam, the charges of the primary particles will create a transverse electrical field which will affect the diameter of the beam. In order for this space charge control to be most effectively used in varying the beam diameter, it is preferable that a relatively high beam current is utilized. For best results, the beam current is at least $$\frac{V_0^{3/2}}{1.27 \times 10^{20} \sqrt{m_1} \left(\frac{L}{r_0}\right)^2} \text{ amperes}$$

where $V_0$ is the acceleration potential in volts of a charged particle; $m_1$ is the mass of said particle in kilograms; $r_0$ is the radius of the beam at the principal plane of said lens and $L$ is the distance from said principal plane to the focal point. Preferably, the structure of the envelope is such that all points on the inside surface of the envelope in any plane perpendicular to the beam axis are equidistant from the beam axis.

The simplest envelope structure which provides such parameters is a cylinder or a truncated cone.

In accordance with a more particular aspect of the present invention, the envelope is disposed adjacent to but separated from the target, and the beam diameter is controlled additionally by applying a selected D.C. electrical potential to the target. This potential applied to the target coacts with the potential applied to the envelope to control the beam diameter in the following manner:

In the case where the applied potential to the envelope remains at only ground potential and the potential applied to the target remains at least at ground, i.e., does not become negative, the beam diameter may be increased by increasing the potential of the target or the beam diameter may be decreased by decreasing the potential applied to the target;

When the selected potential applied to the envelope is at a level other than ground, then the beam diameter may be increased by changing the potential applied to the target in a direction away from ground potential, i.e., either to a greater positive or negative potential, or, vice versa, the beam diameter may be decreased by changing the target potential in a direction toward ground.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 2 is a partial diagrammatic sectional view of a portion of the apparatus of FIG. 1 which illustrates in greater detail how the method of the present invention is utilized to vary the beam diameter of an ion beam.

FIG. 3 is a chart showing the effects of varying the target potentials at various envelope potential levels for ion beams.

DESCRIPTION OF THE PREFERRED EMBODIMENTS

Figure 1:
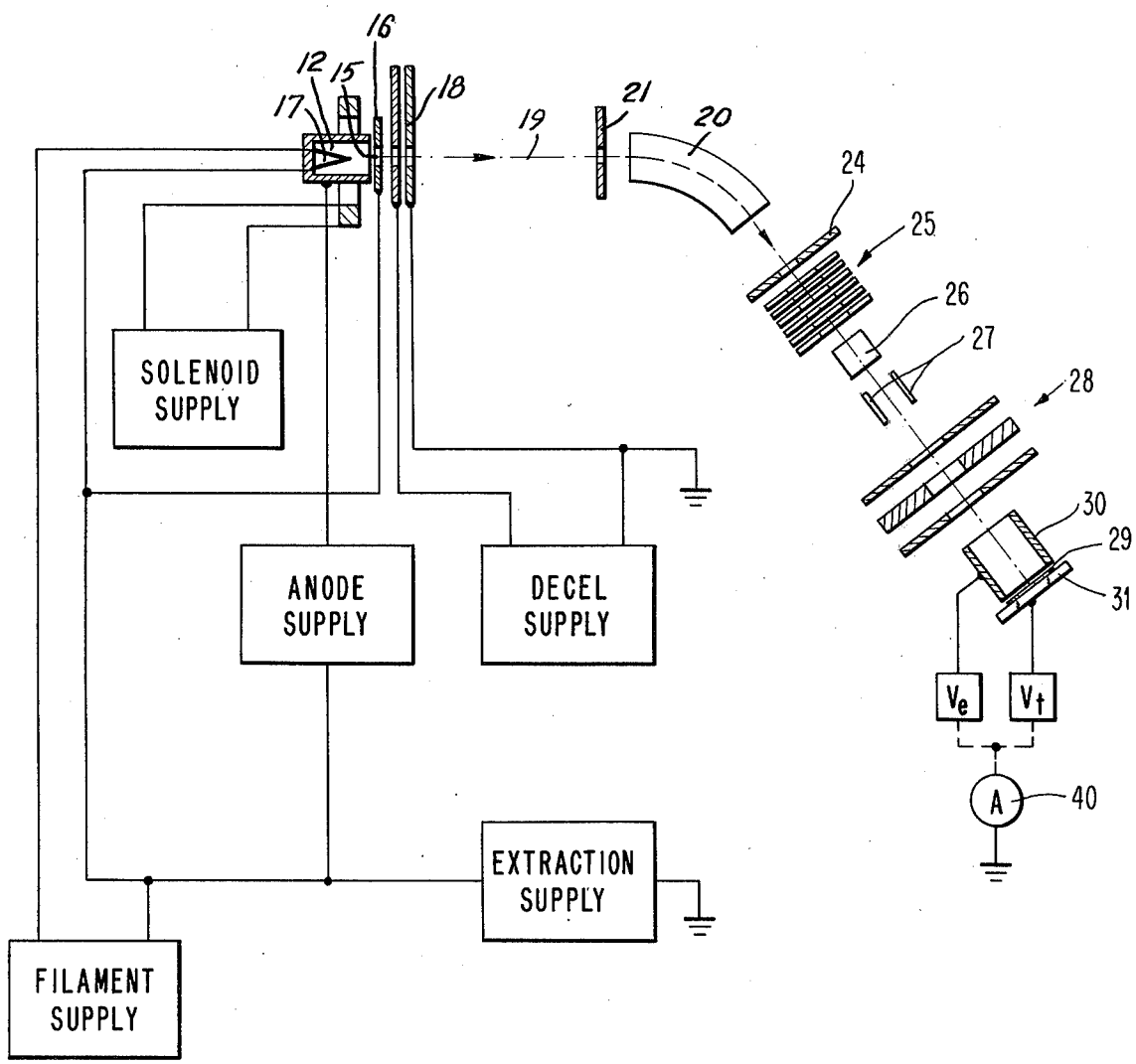
FIG. 1 discloses a schematic representation of ion implantation apparatus which may be utilized to practice the method of the present invention.

Referring now to the drawings, and initially to FIG. 1, the beam diameter control method of the present invention will be described with respect to a method utilizing ion implantation apparatus. However, it should be understood that the principals of the present invention are equally applicable to methods utilizing electron beam apparatus for the purpose of varying the diameter of the electron beam, and one skilled in the art should be readily able to apply the principals of the present invention to electron beam apparatus.

It should be recognized that the apparatus of FIG. 1 is schematic in nature and represents a conventional ion implantation apparatus such as that described in U.S. Pat. No. 3,756,862. The apparatus in FIG. 1 includes a conventional ion source 12 which may be any suitable high density source, although in the embodiments illustrated a hot filament electron impact source is shown, adapted to be operated in an oscillating electron discharge mode. An ion beam is extracted from the source in the conventional manner through extraction electrode 16 via aperture 15. Electrode 16 which is also known as an accel-electrode is maintained at a negative potential by the decel supply illustrated to extract ions from the source, the source electrode 17 being maintained at a positive potential by the anode supply. A decel-electrode 18 is also provided, adapted to be maintained at ground potential. It should be recognized that the bias voltages described may be varied in the operation of the device by those skilled in the art.

The beam extracted from the ion source by the electrode arrangement disclosed is transmitted along a beam path generally indicated at 19 to an analyzing magnet 20 of conventional design. The beam is further defined in the conventional manner by the combination of apertured plate 21 located on one side of the analyzing magnet and mask-defining aperture plate 24 located on the other side of the analyzing magnet. The defined beam is then passed through accelerator 25 which is preferably a constant gradient accelerator which accelerates the ion beam to an energy level in the order of from 30 Kev to several Mev. The ion beam accelerator may be any conventional ion beam accelerator as described in the text, "Ion Beams," R. G. Wilson et al, published by Wiley-Interscience, 1973 at pages 420 – 430, and pages 227 – 246.

The accelerated beam is then passed between the steering plates 26 and 27. These plates are formed in parallel pairs for conventional electrostatic scanning or deflection of the beam in the selected geometric pattern required for the beam writing operation. The pair of steering plates 26 are for moving the beam in the X direction and the pair of steering plates 27 are for moving the beam in the Y direction.

After the beam is deflected by steering plates 26 and 27 in the selected geometric configuration, it is passed through focusing lens 28 which focuses the beam on the target 29 which for purposes of the present illustration may be regarded as the semiconductor wafer which is being fabricated into the integrated circuit by the ion implantation operation. Lens 28 may be a conventional einzel lens and in particular, a Leibmann type of einzel lens which is described in greater detail in the previously mentioned Seliger et al publication.

After being focused and before reaching the target, the beam is passed through envelope 30 formed of a conductive material such as metal; voltage supply $V_e$ provides the potential source connected to envelope 30 which may be varied in the manner which will be hereinafter described. Voltage supply $V_t$ is connected to target 29 through a conductive wafer support 31. Voltage supply $V_t$ is also capable of being varied in the method which will be hereinafter described.

There will now be described the method of the present invention with reference to the above described ion beam writing apparatus. The formation of the beam, the transport of the beam and the scanning or deflection of the beam at parallel plate pairs 26 and 27 is conventional in the ion beam writing art. Accordingly, the novelty of the method of the present invention will be particularly described with reference to FIG. 2 which is an enlarged view of that portion of the apparatus of FIG. 1 involving the focusing lens 28, the envelope 30 and the target 29.

Envelope 30 is coaxial with the beam 32; envelope 30 should fully enclose the beam. While envelope 30 is preferably cylindrical, the method of the present invention will be operable with other envelope shapes which are coaxial with the beam. Preferably, the envelope should be so shaped that all points on the inside surface of the envelope in any plane perpendicular to the beam axis are equidistant from the axis. For example, if one considers plane 33 which is designated by phantom lines perpendicular to axis 36 of the beam 32, then points on the inner surface of cylinder 30 in plane 33 such as points 34 and 35 would be equidistant from axis 36. A truncated cone-shaped envelope also meets this description and would be adequate for the practice of the present invention. Envelope 30 is electrically isolated from target 29 which is the wafer; in the present case, the envelope is spaced from the wafer which is mounted on conductive support 31.

Target 29 is stationary and beam 32 is scanned across the target by steering plates 26 and 27. If we consider initial operating conditions where $V_e$, the potential applied to envelope 30 and $V_t$, the potential applied to target 29, are ground, then the diameter of beam 32 will be that shown in solid lines in FIG. 2. This would represent the smallest diameter of beam 32. From this minimal diameter, the beam diameter may be extended by increasing the envelope potential $V_e$ in a direction away from ground, i.e., either by making $V_e$ more positive or more negative. For example, in the apparatus shown, if the potential, $V_e$, is increased to either +45 volts or −150 volts, then the beam diameter may be increased from a minimum diameter of 1 micron to a maximum diameter of 5 microns (the beam 32B designated by dotted lines). Of course, by increasing $V_e$ away from ground to an intermediate level potential, either positive or negative, various intermediate diameter beams may be achieved as designated by dotted line beam 32A.

If desired, a further variation in the beam diameter may be imposed by varying $V_t$, the potential level applied to the target wafer 29. As indicated by the chart shown in FIG. 3, the affect of variations in $V_t$ is dependent on the final potential level $V_e$ applied to the envelope 30. When the final $V_e$ is either at a positive or negative level, i.e., a level other than ground, then the beam diameter may be increased by changing $V_t$ in a direction away from ground potential (making it more positive or negative), or the beam diameter may be decreased by changing $V_t$ in a direction toward ground (making it less positive or negative).

If the final potential of $V_e$ is at ground, then changing the potential $V_t$ has no affect if the initial value of $V_t$ is negative. On the other hand, if the final potential $V_e$ is at ground and the initial potential of $V_t$ is not negative, i.e., is either at ground or is positive, then the beam diameter may be increased by increasing the $V_t$ and decreased by decreasing $V_t$.

It should be noted that in describing the correlated affect of changes in the level of potential $V_e$ applied to the envelope and $V_t$ applied to the target, for purposes of illustration, we are treating the changes as if the change in $V_e$ is final before the change in $V_t$ is initiated. It should be understood, of course, these changes may be carried on simultaneously. However, in calculating the expected cumulative affect, the procedure is simplified if the change in $V_e$ is considered to be final before the change in $V_t$ is initiated.

In order for the method of the present invention to function effectively, it is preferably for the beam to have a beam current of at least $$\frac{V_0^{3/2}}{1.27 \times 10^{20} \sqrt{m_1} \left(\frac{L}{r_0}\right)^2} \text{ amperes}$$

where $V_0$ is the acceleration potential in volts of a charged primary particle such as an ion in an ion beam or an electron in an electron beam; $m_1$ is the mass of the primary particle in kilograms; $r_0$ is the radius of the beam in the principal plane of the lens. The principal plane of lens 28 in FIG. 2 is shown by the phantom line 37. In an einzeltype lens system such as lens system 28, the principal plane passes through the center of the central lens. In FIG. 2, the radius of the beam $r_0$ at this principal plane is indicated. Finally, L is a distance from the principal plane to the focal point of the lens system 28. As shown in FIG. 2, the focal point is substantially at target wafer 29.

With beam currents at the level described, it is believed that the effect that changes to the potential level $V_e$ applied to the envelope have upon beam diameter is due to changes in the cloud of secondary particles, i.e, secondary electron cloud in ion beams or secondary ion cloud in E-beams which are attracted to and normally neutralize the principal beam. It appears that changes in the potential $V_e$ applied to the envelope will affect the cloud of secondary particles. To illustrate, with respect to FIG. 2, when $V_e$ is changed away from ground in a positive direction, more electrons from the electron cloud accompanying beam 32 will be attracted from the beam toward the envelope. This will cause an unnuetralized beam 32 which will create a transverse electric field across the beam caused by the repelling of each other by the positive ions in the beam. As a result, the beam will expand. Conversely, the decrease in the positive potential $V_e$ in the direction toward ground will repel electrons from envelope 30 back to the beam 32, thereby making the beam more neutral and reducing the transverse electric field to permit the beam to contract again.

Similarly, if $V_e$ is at ground potential or negative potential, increasing the negative potential $V_e$ has a like affect; the negative envelope appears to repel the electron cloud, forcing it out through open ends 38 and 39 of the envelope. In the case where target 29 is biased negative by $V_t$, the electron cloud will primarily be forced out open end 38. Again, as a result of the diminution of the neutralizing electron cloud, the previously described transverse field will be created and the beam diameter will increase. Similarly, if the negative potential $V_e$ applied to envelope 30 is decreased again back toward ground, the neutralizing electron cloud will return and the beam diameter will contract.

The previously noted affects of changes in $V_t$ on the beam diameter may be similarly explained in correlation with the final level of $V_e$. With reference to FIGS. 2 and 3 and irrespective of the final value of $V_e$, when $V_t$ is moved away from ground potential toward a more positive potential the beam diameter expands because the secondary electron cloud in the vicinity of target 29 is diminished due to high level of electrons attracted to the more positively charged target. Conversely, as a positive potential $V_t$ is reduced toward ground potential, the electron cloud in the beam in the vicinity of the target will be reinstated and the diameter will again decrease.

On the other hand, if the potential $V_t$ is made more negative in a direction away from ground potential, then, the beam diameter will still expand if the final potential $V_e$ is at a level other than ground. For example, in such a case, if $V_e$ is positive, then the electron cloud in the beam in the vicinity of the target which is repelled by making the target more negative would be attracted by the positively biased envelope 30. The electron cloud being thus diminished would cause the beam diameter to expand. The converse would, of course, be the effect when the negative potential on the target would be reduced to reinstate the electron cloud. Similarly, if $V_e$ were negative and the envelope 30 were negatively biased, then when $V_t$ would be made more negative away from ground potential, the repelled electron cloud would further be repelled by negatively biased walls 30 out through the back opening 38 of the envelope. The converse affect may be similarly explained.

Finally, if the final value of $V_e$ is ground potential, and $V_t$ is made more negative away from its ground potential, the repelled secondary electron cloud would have no place to go and apparently would pile up in the vicinity of the target interfering with any beam expansion.

In considering the aforementioned theoretical explanation, it should be noted that the affects of the changes in $V_e$ in combination with $V_t$ to expand or contract the beam diameter have been observed, and that the explanation is a theoretical one offered by us in explanation of the observed phenomena.

If desired, a combination of envelope 30 and wafer 29 may be utilized as a Faraday Cage to measure beam current merely by connecting envelope 30 and target 29 to an ammeter 40 which is shown in dotted line to provide the sum of the envelope wall current and target current giving the overall beam current in accordance with the principals set forth in our co-pending U.S. Patent Application, Ser. No. 629,181, filed Nov. 5, 1975. In the method of the present invention, because of the relatively narrow dimension of the beam used for beam writing with respect to the diameter of the envelope 30, the walls of envelope 30 need not be at ground potential as set forth in the copending application. An accurate measurement of beam current may be obtained in the case of ion beams if the walls are either at ground potential or at a positive potential.

With reference to the equation previously given setting forth the beam current level under which the method in the present invention is preferably operable, the background of the equation is set forth in the text, "Ion Beams," R. G. Wilson et al, published by Wile-Interscience, 1973, at pages 132 – 143.

While the invention has been particularly shown and described with reference to the preferred embodiments thereof, it will be understood by those skilled in the art that various changes in form and details may be made therein without departing from the spirit and scope of the invention.

What is claimed is:

1. In the method of bombarding a target with a beam of primary charged particles, a method for varying the diameter of said beam having a beam current of at least $$\frac{V_0^{3/2}}{1.27 \times 10^{20} \sqrt{m_1} \left(\frac{L}{r_0}\right)^2} \text{ amperes}$$

where $V_0$ is the acceleration potential in volts of a charged particle; $m_1$ is the mass of said particle in kilograms; $r_0$ is the radius of the beam at the principal plane of said lens and L is the distance from said principal plane to the focal point, comprising:
  focusing the beam through a lens,
    passing the focused beam through an envelope of conductive material, said envelope spaced from and coaxial with said beam, at least the portion of said envelope being disposed between said lens and beam focal point,
  applying a selected D.C. electrical potential to the envelope, and
  controlling the beam diameter by changing and potential in a direction away from ground potential to increase the beam diameter or by changing said potential in a direction toward ground potential to decrease the beam diameter.

2. The method of claim 1 wherein said primary particles are ions.

3. The method of claim 1 wherein said primary particles are electrons.

4. The method of claim 1 wherein said all points on the inside surface of said envelope in any plane perpendicular to the beam axis are equidistant from said axis.

5. The method of claim 1 wherein said envelope is disposed adjacent but separated from said target, and including the further steps of
  applying a selected D.C. electrical potential to said target, and
  further controlling the beam diameter as follows:
  when said selected potential applied to the envelope is only ground and the potential applied to the target remains at least at ground, by increasing the target potential to increase the beam diameter or decreasing the target potential to decrease the beam diameter, and
  when said selected potential applied to the envelope is not ground, by changing the potential applied to the target in a direction away from ground potential to increase the beam diameter or by changing the target potential in a direction toward ground to decrease the beam diameter.

6. The method of claim 1 further including the step of focusing the beam prior to passing the beam through envelope, and the beam length, L is the distance from the principal plane of the lens to the target.

7. The method of claim 5, further including the step of focusing the beam prior to passing the beam through the envelope and the beam length, L is the distance from the principal plane of the lens to the target.

8. The method of claim 6 further including the step of moving said beam with respect to the target in a selected pattern to produce beam writing on said target.

9. The method of claim 7 further including the step of moving said beam with respect to the target in a selected pattern to produce beam writing on said target.

10. The method of claim 1 wherein the focal point of the beam is substantially at the target.

* * * * *

UNITED STATES PATENT AND TRADEMARK OFFICE
CERTIFICATE OF CORRECTION

PATENT NO. : 4,013,891
DATED : March 22, 1977
INVENTOR(S) : Wen-Chuang Ko et al

It is certified that error appears in the above-identified patent and that said Letters Patent are hereby corrected as shown below:

Claim 1, Col. 8, Line 20      delete "and" and substitute therefor -- said --

Signed and Sealed this

Ninth Day of May 1978

[SEAL]

Attest:

RUTH C. MASON
Attesting Officer

LUTRELLE F. PARKER
Acting Commissioner of Patents and Trademarks